United States Patent [19]

Rapp et al.

[11] 3,732,503

[45] May 8, 1973

[54] PROXIMITY SWITCH INCLUDING VARIABLE FREQUENCY OSCILLATOR WITH FERRITE CONTROL ELEMENT

[76] Inventors: Werner Rapp, Suedmaehrer Str. 26, 7340 Geislingen; Werner Albrecht, Stuttgarter Str. 23, 7022 Leinfelden, both of Germany

[22] Filed: Feb. 11, 1972

[21] Appl. No.: 225,453

Related U.S. Application Data

[63] Continuation-in-part of Ser. No. 8,493, Feb. 4, 1970, abandoned.

[52] U.S. Cl. ....................331/65, 307/129, 317/146, 317/148.5 R, 331/77, 331/117 R, 331/181, 336/30, 340/258 C

[51] Int. Cl. ......G08c 21/00, H01f 21/06, H03b 5/12

[58] Field of Search ......................331/65, 77, 117 R, 331/181; 328/5; 307/129, 130, 308; 317/146, 148.5 R; 324/59; 340/258 C, 282; 336/30

[56] References Cited

UNITED STATES PATENTS

| | | | |
|---|---|---|---|
| 3,005,351 | 10/1961 | Goodman et al. | 331/181 X |
| 3,147,408 | 9/1964 | Yamamoto et al. | 331/65 X |
| 3,503,007 | 3/1970 | Kutschbach | 331/117 |

*Primary Examiner*—Roy Lake
*Assistant Examiner*—Siegfried H. Grimm
*Attorney*—Arthur O. Klein

[57] ABSTRACT

A proximity switch is provided having an oscillator with a resonant circuit with a variable inductance. The output of the oscillator is fed through a low pass filter and rectifier to a switching circuit which is activated at a predetermined amplitude. The proximity switch is activated when a control body of non-magnetizable ferrite material is moved in close proximity to the inductor of the resonant circuit, thereby increasing the inductance and reducing the frequency of oscillation, and maintaining or increasing the amplitude of the output of the oscillator, the lower frequency and high amplitude signal being passed by the low pass filter and applied after rectification to activate the switch. The switch is not activated by electrically conductive materials because the frequency of the oscillator does not change and the amplitude of its output is damped, and it is not actuated by magnetic materials such as steel chips or permanent magnets because of high eddy current and hysteresis losses induced into the resonant circuit and damping of its output which fail to provide the output necessary to trigger the switch.

5 Claims, 1 Drawing Figure

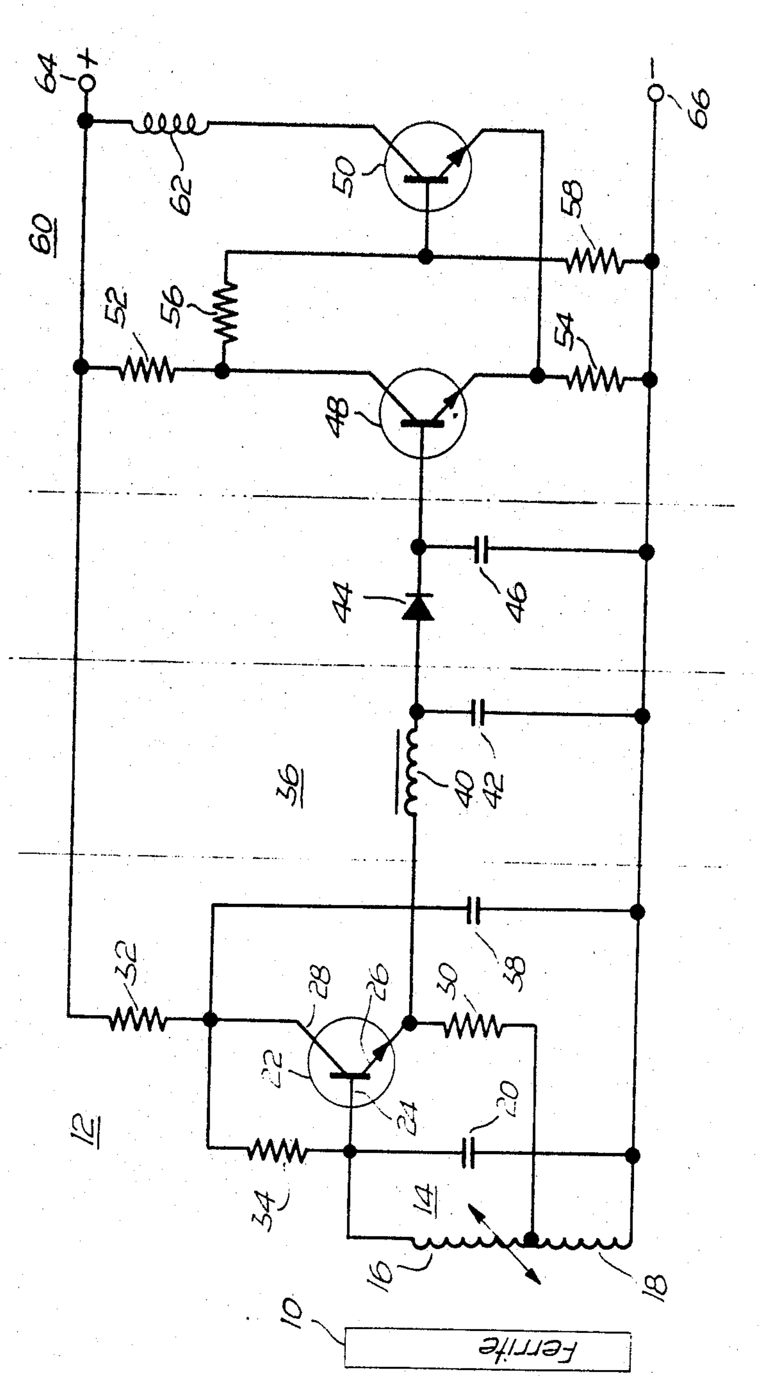
Ferrite

PROXIMITY SWITCH INCLUDING VARIABLE FREQUENCY OSCILLATOR WITH FERRITE CONTROL ELEMENT

RELATED APPLICATIONS

This application is a continuation-in-part of our prior application Ser. No. 8,493, filed Feb. 4, 1970, and now abandoned.

BACKGROUND OF THE INVENTION

This invention relates to a proximity switch which performs a control function in the presence of a body of non-permanently magnetizable ferrite material and prevents false activation by other types of material such as electrically conductive and magnetic materials.

Many applications exist, such as machine tools, conveyors, and other moving mechanisms, where it is desirable to provide a control function when a moving part reaches a predetermined position. Proximity switches have been provided for performing these functions which are mechanically activated by the approaching control element. Since contact is not always possible or desirable, non-contact switches have been provided which are controlled magnetically, capacitatively, or inductively. Known inductively controlled proximity switches employ a resonant circuit which is damped by the approach or proximity of electrically conductive or magnetically controlled elements which vary the inductance of the resonant circuit. The increased damping of the resonant circuit caused by the approaching control element results in a change in amplitude of the current of the resonant circuit which is utilized for effecting a control function. Such proximity switches suffer the disadvantage of effecting a control function not only when the desirable controlled element approaches the induction coil of the resonant circuit, but also when other electrically conductive or magnetic parts pass into the vicinity of the induction coil. This particularly applies where the proximity switch is utilized in connection with machine tools, where it is very difficult, if not impossible, to prevent chips of electrically conductive and magnetic materials, such as steel chips, from passing into the vicinity of the induction coil of the proximity switch. One form of prior art switch uses a permanent magnet as a control element whose purpose would be defeated by iron or steel chips adhering to the magnet. The switching time could be affected by the chips adhering, or so many chips could be attracted that the switch would not operate.

SUMMARY OF THE INVENTION

Accordingly, it is an object of this invention to provide a proximity switch which is responsive only to the approach and proximity of a non-magnetizable ferrite control element and is non-responsive to the approach and proximity of other types of material.

In carrying out this invention in one illustrative embodiment thereof, a proximity switch is provided having an oscillator whose output is applied to a low pass filter, rectified, and applied to a switch. The oscillator has a resonant circuit including an inductor, the inductance of which varies on the approach and proximity of a control element of ferrite material. The proximity of the ferrite material increases the inductance and maintains or increases the amplitude of the output of the resonant circuit, reducing the frequency of oscillation of the oscillator, which is applied to the low pass filter. The reduction in the frequency and maintenance of increase of the amplitude of the signal from the oscillator produces a sufficient output from the low pass filter which is rectified and applied to operate the switch.

BRIEF DESCRIPTION OF THE drawing

The drawing is a schematic diagram of an illustrative embodiment of the proximity switch of the type embodied in the present invention.

DESCRIPTION OF THE PREFERRED EMBODIMENTS

In accordance with the present invention, the control element consists of a body of non-magnetizable ferrite material similar to that which is employed in cores of coils used in high-frequency systems. The ferrite material may be made up of small particles of compressed iron powder embedded in a duroplastic synthetic material which provides electrical isolation of the particles and reduces eddy currents. Another type of ferrite material which provides better magnetic properties with reduced eddy current and hysteresis losses is referred to as soft-magnetic ferrites which are prepared by sintering oxides. An example of this type of ferrite is $MeO\cdot Fe_2 0_3$, which utilizes the metal manganese but may also utilize nickel or other suitable metal. A mixtures of ferrites may also be utilized, for example, manganese-zinc ferrite. The purpose of the use of ferrite material as a control element, which will become apparent in the following description, is its capability of considerably increasing the inductance of an inductance coil which forms the part of a resonant circuit while producing practically no damping of the resonant circuit. This is accomplished by moving the control element of ferrite material into close proximity to the inductor of the resonant circuit, greatly increasing the flux density to rapidly change the frequency of the resonant circuit and maintain or increase the amplitude of its output which may be used for performing the control function.

If it is not necessary to design the circuit for the possible presence of permamently magnetized bodies then the circuit can be designed to produce a switching operation without a low-pass filter, since the increase in amplitude can then only be caused by the control element of ferrite material. "Non-magnetizable ferrite material" means a material which is magnetically conductive but not permamently magnetizable. Referring now to the drawing, the proximity switch embodied in this invention is comprised of the control element 10 of non-magnetizable ferrite material described above, an oscillator 12, a lowpass filter 36, a rectifier 44, and a switch circuit 60. The oscillator circuit 12 is a conventional feedback oscillator having a transistor amplifier 22 with base, emitter, and collector electrodes 24, 26, and 28 respectively. The oscillator 12 has a resonant or tank circuit 14 comprised of inductors 16 and 18 shunted by capacitor 20 which is connected at one end thereof to the base electrode 24 of transistor 22. The emitter electrode 26, at which the output of the oscillator appears, is coupled via a feedback resistor 30 to the junction of inductors 16 and 18. A source of positive biasing potential from terminal 64 is applied via resistor 32 to the collector electrode 28. A resistor 34 is coupled between the collector electrode 28 and the base 22 for fixing the operating point of the base electrode 24. A capacitor 38 is connected between the collector electrode 28 and the opposite side of the resonant circuit 14 for maintaining the alternating voltage of the oscillator. The feedback path supplied by resistor 30 returns a portion of the output of transistor 22 to the resonant circuit 14 to supply alternating components of the proper phase and magnitude to sustain oscillations. Other forms of oscillators can be used, which include a resonant circuit whose frequency can be changed by a change of the inductance of the resonant circuit.

The output of the emitter electrode 26 of transistor 22, and accordingly oscillator 12, is applied to a low-pass filter 36 comprised of an inductor 40 and a capacitor 42. The filter 36 is designed to pass low frequency signals with the inductor 40 providing little resistance to such signals and the capacitor 42 providing a large impedance to such signals. In the present embodiment the low-pass filter 36 is designed such that the frequency of the oscillator 12, when not influenced by the ferrite property of the control element 10, produces an output from the filter 36 which is small, compared to that with the approach or proximity of the ferrite body 10. It will be appreciated that other forms of low-pass filters can be utilized which will produce the same or a similar result.

A rectifier 44 is connected between the output of low-pass filter 36 and the base electrode of a transistor 48 which comprises an element in the switch 60. Rectifier 44 provides a D.C. signal of suitable polarity for controlling the switch 60. A capacitor 46 is connected across the output of the rectifier 44 for smoothing the ripple in the rectified voltage from the rectifier 44.

The primary purpose of the switch 60 is to provide a switching or control function when the amplitude of the signal applied from the rectifier 44 reaches a predetermined level. Any form of switch may be utilized which produces this function. In the illustrative embodiment, the conventional flip-flop circuit known in the art as a Schmitt trigger is utilized. Schmitt trigger switch circuit 60 is comprised of transistors 48 and 50, having a common emitter-resistor 54 connected to the negative terminal 66. A resistor 58 is connected between the negative terminal 66 and the base electrode of transistor 50, and a resistor 56 is connected between the collector electrode of transistor 48 and the base electrode of transistor 50. The combination of resistors 56 and 58 determine the potential on the base of transistor 50, and also the voltage at which the Schmitt trigger operates. A biasing resistor 52 is connected between the positive terminal 54 and the collector electrode of transistor 48, and a load resistor 62 is connected to the collector electrode of transistor 50 and may be in the form of the resistance of a relay which is actuated by the conduction of transistor 50. When switch 60 is in its non-activated position, that is when the control element 10 is not in proximity to the resonant circuit 14, transistor 48 is normally conductive and transistor 50 non-conductive. As the voltage on the base of transistor 48 is increased, cutting off transistor 48, then transistor 50 becomes conductive and the current which flows therethrough energizes relay 62 to perform the control function.

The mode of operation of the proximity switch will now be described. When the ferrite control element 10 is spaced from the resonant circuit 14 at such a distance that it does not influence the inductance of the resonant circuit 14, the frequency of the resonant circuit 14 is so high and the amplitude of its output insufficient to allow low pass filter 36 to supply enough voltage to activate the switch 60. When the control element 10 approaches the inductors 16 and 18, it increases the inductance of the resonant circuit 14, and accordingly reduces the frequency of the resonant circuit 14 without reducing and usually increasing the amplitude of its output. The low frequency filter 36 is designed to allow passage of signals of a frequency which are at least 30% lower than the frequency which the resonant circuit 14 possesses when it is not influenced by the control element 10. The substantially reduced frequency of the resonant circuit 14, together with the increased output of the oscillator 12 pass the filter 36, are rectified by rectifier 44, and applied to the base of transistor 48, which cuts off transistor 48, turning on transistor 50, and actuating the relay 62. When the control element 10 is again moved away, transistor 48 again begins conducting and transistor 50 is shut off, returning the switch to its initial position. As has been pointed out, one of the advantages of the present invention is that the circuit will not be materially affected by other electrically conductive or magnetic materials, such as metal chips, which is essential to prevents false activation. If a foreign body other than the ferrite control element 10 approaches the coils 16 and 18, the switch 60 is not activated because it will not substantially affect the frequency of the oscillator nor the amplitude of its output in the manner contemplated in the present invention. For an electrically conductive element, the inductance is not changed, and so the frequency of the oscillator does not change. If the foreign body is a magnet, or a magnetizable material such as iron chips, the inductance of the resonant circuit 14 is either reduced, increasing the frequency of the oscillator, or the high eddy current and hysteresis losses, as compared with the ferrite control element, so reduce the output of the oscillator that sufficient voltage is unavailable to activate the switch 60.

Since other modifications, varied to fit particular operating requirements and environments will be apparent to those skilled in the art, the invention is not considered limited to the example chosen for purposes of disclosure, but covers all changes and modifications which do not constitute departures from the true spirit and scope of this invention.

What is claimed is:

1. A proximity switch comprising a. an oscillator including a resonant circuit having a variable inductor, b. a control element of non-permanently magnetizable ferrite material movable to and away from the variable inductor of said resonant circuit, c. said control element of ferrite material when a predetermined distance from said inductor of said resonant circuit producing a changed output from said oscillator by increasing the inductance of said inductor, thereby decreasing the frequency of oscillation while maintaining or increasing the amplitude and voltage of the output of said oscillator, d. circuit means responsive to said changed output from said oscillator to produce a control signal, and e. switch means coupled to said circuit means operating in response to said control signal.

2. A proximity switch comprising a. an oscillator including a resonant circuit having a variable inductor, b. a control element of non-permanently magnetizable ferrite material movable to and away from the variable inductor of said resonant circuit, c. said control element of ferrite material when a predetermined distance from said inductor of said resonant circuit producing a changed output from said oscillator by increasing the inductance of said inductor, thereby decreasing the frequency of oscillation while maintaining or increasing the amplitude and voltage of the output of said oscillator, and d. circuit means responsive to said changed output from said oscillator to produce a control signal, said circuit means including a low-pass filter and a switch means, said low-pass filter passing a larger amplitude signal in response to said changed output from said oscillator for operating said switch means.

3. The proximity switch set forth in claim 2 wherein a rectifier means is connected between the output of said low-pass filter and the input of said switch means for rectifying the output of said low-pass filter.

4. The proximity switch set forth in claim 2 wherein said switch means operates on a predetermined amplitude signal which is applied when said ferrite control element is in a predetermined position with respect to said inductor.

5. The proximity switch set forth in claim 4 having a rectifier means connected between the output of said low-pass filter and the input of said switch means for rectifying the output of said low-pass filter, said switch means comprising a flip-flop circuit which changes state on the receipt of said predetermined amplitude signal from said rectifier means.

* * * * *